United States Patent [19]
Cho

[11] Patent Number: 5,869,361
[45] Date of Patent: Feb. 9, 1999

[54] THIN FILM TRANSISTOR AND METHOD FOR FABRICATING THE SAME

[75] Inventor: Seok-Won Cho, Chungcheongbuk-do, Rep. of Korea

[73] Assignee: LG Semicon Co., Ltd., Chungcheongbuk-Do, Rep. of Korea

[21] Appl. No.: 4,278

[22] Filed: Jan. 8, 1998

[30] Foreign Application Priority Data

Jul. 25, 1997 [KR] Rep. of Korea ................. 1997-35149

[51] Int. Cl.$^6$ ................................................ H01L 29/786
[52] U.S. Cl. .......................... 438/156; 438/159; 257/160; 257/302
[58] Field of Search .................................... 438/149, 150, 438/151, 152, 153, 154, 155, 159, 156; 257/57, 58, 59

[56] References Cited

U.S. PATENT DOCUMENTS

| | | | |
|---|---|---|---|
| 5,266,507 | 11/1993 | Wu | 438/154 |
| 5,298,780 | 3/1994 | Harada | 257/330 |
| 5,334,862 | 8/1994 | Manning et al. | 257/67 |
| 5,407,846 | 4/1995 | Chan | 257/57 |

OTHER PUBLICATIONS

A Polysilicon Transistor Technology for Large Capacity SRAMs, Shuji Ikeda et al., IEDM 90 pp. 469–472 (1990).

*Primary Examiner*—Olik Chaudhuri
*Assistant Examiner*—William David Coleman
*Attorney, Agent, or Firm*—Morgan, Lewis & Bockius LLP

[57] ABSTRACT

A thin film transistor includes a substrate with a trench having first and second sides and a bottom, and a gate electrode at one of the first and second sides of the trench. The thin film transistor further includes a gate insulating layer on the entire surface of the substrate including the gate electrode, and an active layer on the gate insulating layer along the trench, the active layer having source and drain regions substantially outside the trench.

8 Claims, 6 Drawing Sheets

THIN FILM TRANSISTOR AND METHOD FOR FABRICATING THE SAME

This application claims the benefit of Korean application No. 35149, filed on Jul. 25, 1997, which is hereby incorporated by reference.

BACKGROUND OF THE INVENTION

1. Field of the Invention

The present invention relates to a semiconductor device, and more particularly, to a thin film transistor and a method for fabricating the same.

2. Discussion of the Related Art

A thin film transistor (TFT) has been used instead of a load resistor or CMOS load transistor of an SRAM of more than 1M class. It is also used as a switching device which transforms picture data signals for pixel areas in a liquid display device. Particularly, in an SRAM cell using a PMOS TFT as a load transistor, the off-current of a PMOS can be reduced and the on-current of the PMOS can be increased, thereby reducing the power consumption and enhancing the memory performance.

An offset region significantly contributes stable performance to an SRAM cell, for example. Accordingly, the structure and the method of forming the offset region are important in the manufacture of semiconductor devices having offset regions.

Figure 1:
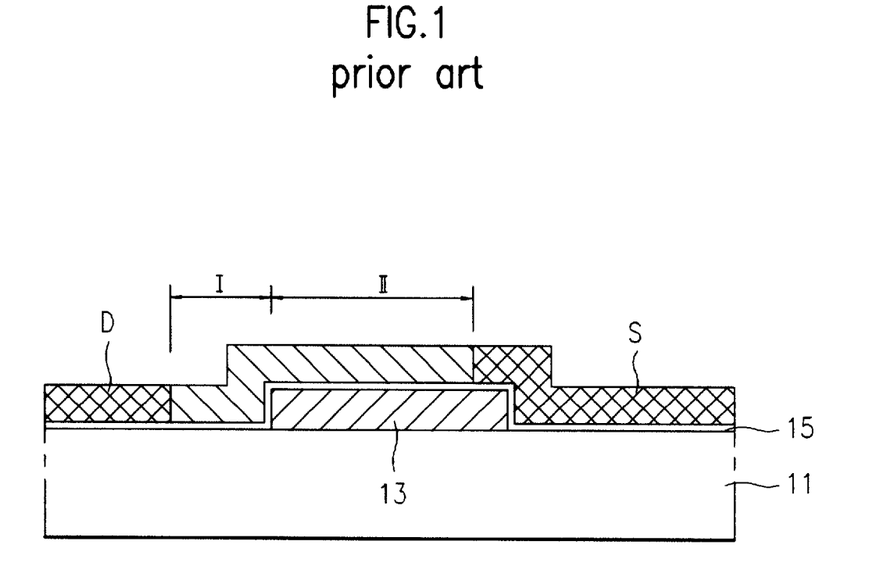
FIG. 1 is a cross-sectional view showing a structure of a conventional TFT.

A conventional TFT and a method for fabricating the same will be described with reference to the accompanying drawings. FIG. 1 is a cross-sectional view of a conventional TFT, which includes an insulating layer 11, a gate electrode 13, a gate insulating layer 15, source and drain regions S/D, an offset region I, and a channel region II.

The gate electrode 13 is formed on a predetermined area of the insulating layer 11. The gate insulating layer 15 is formed on the insulating layer 11 including the gate electrode 13. The source region S is formed on the gate insulating layer 15 to overlap an edge of the gate electrode 13. The drain electrode D is formed on the gate insulating layer 15 apart from the gate electrode 13. The channel region II is defined from the end of the source region S formed over the gate electrode 13 to one end of the gate electrode 13. The offset region I is defined from the end of the gate electrode 13 to the end of the drain region D.

FIGS. 2A to 2E are cross-sectional views showing process steps of a conventional method for fabricating a TFT.

Figure 2A:
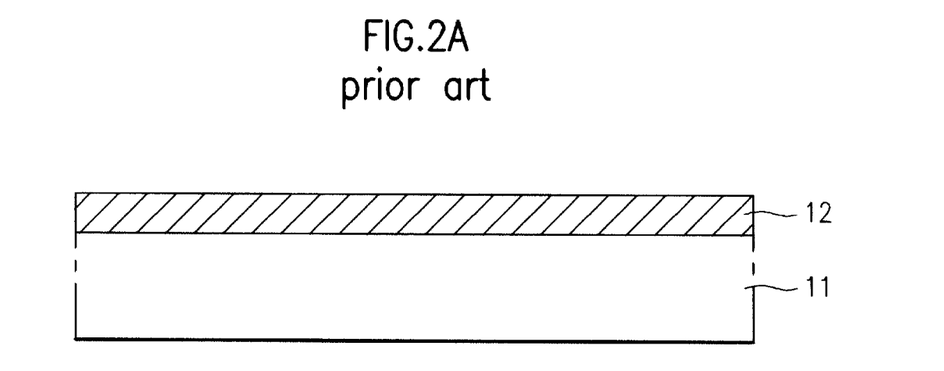
FIGS. 2A to 2E are cross-sectional views showing process steps of a method for fabricating the conventional TFT.

Referring to FIG. 2A, a first polysilicon layer 12 is formed on an insulating layer 11. A photoresist film (not shown) is coated on the first polysilicon layer 12 and patterned by an exposure and development process to form a gate pattern of the photoresist film.

Figure 2B:
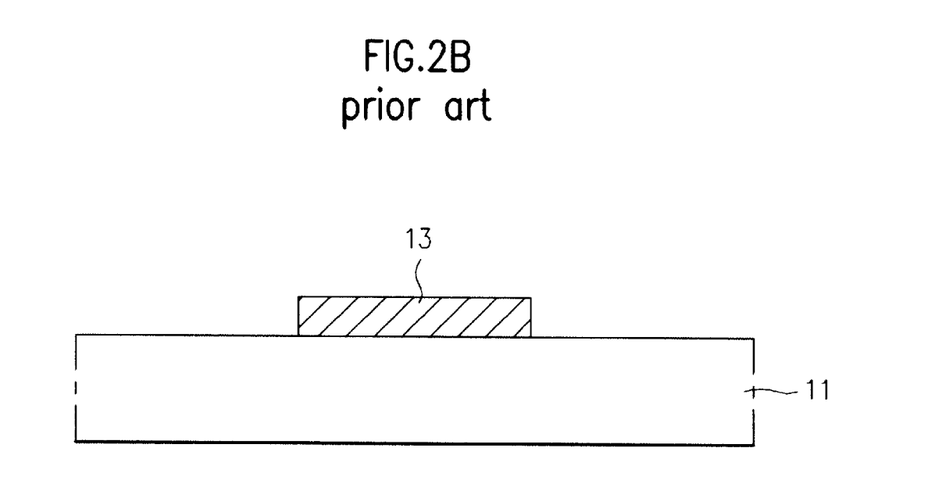

Subsequently, using the gate pattern as a mask, the first polysilicon layer 12 is selectively etched to form a gate electrode 13, as shown in FIG. 2B.

Figure 2C:
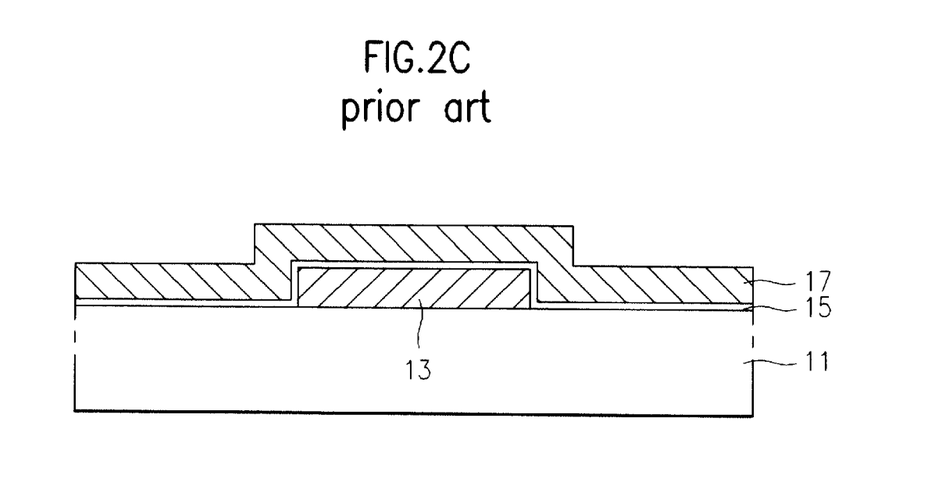

Next, a gate insulating layer 15 is deposited on the insulating layer 11 including the gate electrode 13, as shown in FIG. 2C. Then, a second polysilicon layer 17 is formed on the gate insulating layer 15. The second polysilicon layer 17 is used as source and drain regions S/D as well as channel region II and offset region I.

Figure 2D:
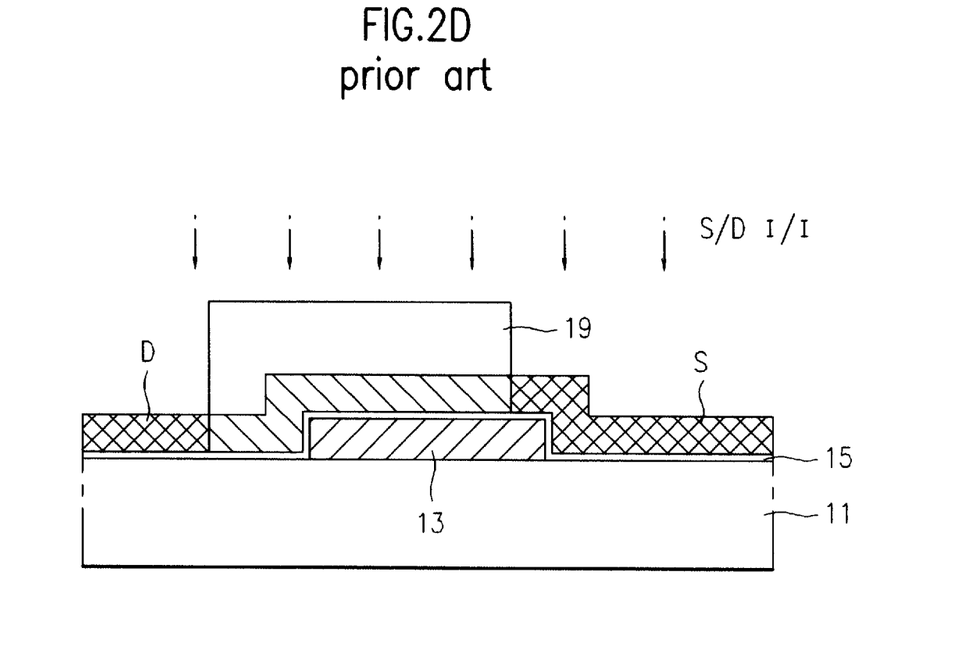

Thereafter, as shown in FIG. 2D, a photoresist film is coated on the second polysilicon layer 17 and patterned by an exposure and development process to form a photoresist pattern 19 for a channel region and an offset region. Using the photoresist pattern 19 as a mask, impurity ions are implanted into the second polysilicon layer 17, thereby forming source and drain regions S and D.

Figure 2E:
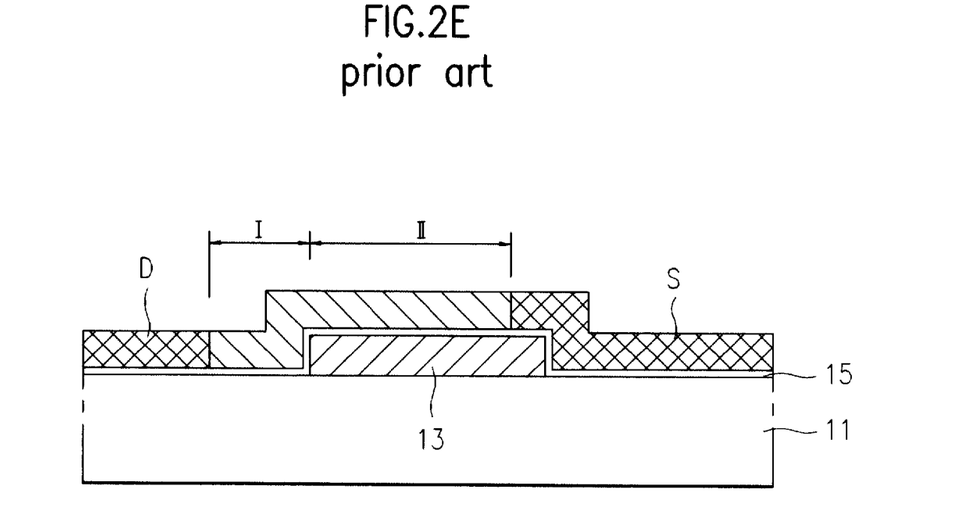

Subsequently, the photoresist patter 19 is removed as shown in FIG. 2E to complete the conventional method for fabricating a TFT. Here, the offset region I is a portion of the second polysilicon layer 17 between the drain region D and the gate electrode 13, and the channel region II is a portion of the second polysilicon layer 17 that corresponds to the gate electrode 13.

Such a conventional TFT has the following problem. Processes using masks are required to form the channel region and the offset regions. It is generally difficult to perform mask alignment and associated photolithography precisely. Offset regions cannot be formed precisely with such an unstable process of mask alignment. This causes instability of the resultant cells.

SUMMARY OF THE INVENTION

Accordingly, the present invention is directed to a TFT and a method for fabricating the same that substantially obviate one or more of the problems due to limitations and disadvantages of the related art.

An object of the invention is to provide a TFT and a method for fabricating the same in which channel regions and offset regions are formed by a self-alignment method so that the whole process is simplified and the offset regions are precisely formed, thereby accomplishing the stability of cells.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a thin film transistor including a substrate with a trench having first and second sides and a bottom; a gate electrode at one of the first and second sides of the trench; a gate insulating layer on the entire surface of the substrate including the gate electrode; and an active layer on the gate insulating layer along the trench, the active layer having source and drain regions substantially outside the trench.

In another aspect, the present invention provides a thin film transistor including a substrate with a trench having first and second sides and a bottom; a gate electrode on the bottom and the first side of the trench and on an upper surface of the substrate adjacent the first side of the trench; a gate insulating layer on the entire surface of the substrate including the gate electrode; an active layer on a predetermined area of the gate insulating layer including the trench, the active layer having source and drain regions over the upper surface of the substrate adjacent the trench, the source and drain regions being in contact with the rest of the active layer in the trench; and an insulating layer on the active layer in the trench between the source and drain regions.

In another aspect, the present invention provides a method for fabricating a thin film transistor, the method including the steps of providing a substrate; forming a trench having first and second sides and a bottom in the substrate; forming a gate electrode on the bottom and the first side of the trench; forming a gate insulating layer on the substrate including the gate electrode; forming an active layer on the gate insulating layer adjacent the trench; and forming source and drain regions in portions of the active layer that are located over an upper surface of the substrate, the source and drain regions being in contact with the rest of the active layer in the trench.

In another aspect, the present invention provides a thin film transistor including a substrate with a trench in an upper surface thereof, the trench having inner surfaces including first and second side walls and a bottom wall; a gate electrode on the second wall and the bottom wall of the trench, the gate electrode extending from the upper edge of the second side wall along the upper surface of the substrate and being absent on the first wall of the trench; a gate insulating layer with a substantially consistent thickness over the entire surface of the substrate including the gate electrode and the trench; a patterned semiconductor layer with a substantially consistent thickness over a portion of the gate insulating layer that is located over the first and second side walls and the bottom wall of the trench, the semiconductor layer having a drain region laterally extending from the upper edge of the first side wall of the trench along the upper surface of the substrate, the semiconductor layer further having a source region laterally extending form the upper edge of the second side wall of the trench along the upper surface of the substrate; and an insulating filling on a portion of the semiconductor layer located in the trench between the source region and the drain region, the insulating filling being absent over each of the source and drain regions of the semiconductor layer.

In a further aspect, the present invention provides a method for fabricating a thin film transistor on a substrate, the method including the steps of removing a portion of the substrate to form a trench in an upper surface of the substrate, the trench having inner walls including first and second side walls and a bottom wall; forming a gate electrode on the second wall and the bottom wall of the trench, the gate electrode extending from the upper edge of the second side wall along the upper surface of the substrate and being absent on the first wall of the trench; forming a gate insulating layer with a substantially consistent thickness over the entire surface of the substrate including the gate electrode and the trench; forming a patterned semiconductor layer with a substantially consistent thickness over a portion of the gate insulating layer that is located over the first and second side walls and the bottom wall of the trench, the semiconductor layer having a first portion extending from the upper edge of the first side wall along the upper surface of the substrate, the semiconductor layer further having a second portion extending form the upper edge of the second side wall along the upper surface of the substrate; forming an insulating filling on a portion of the semiconductor layer located in the trench between the first portion and the second portion of the semiconductor layer, the insulating filling being absent over each of the first and second portions of the semiconductor layer; and implanting impurity ions into the semiconductor layer using the insulating filling as a mask to form drain and source regions at the first and second portions of the semiconductor layer, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, which are illustrated in the accompanying drawings.

Figure 3:
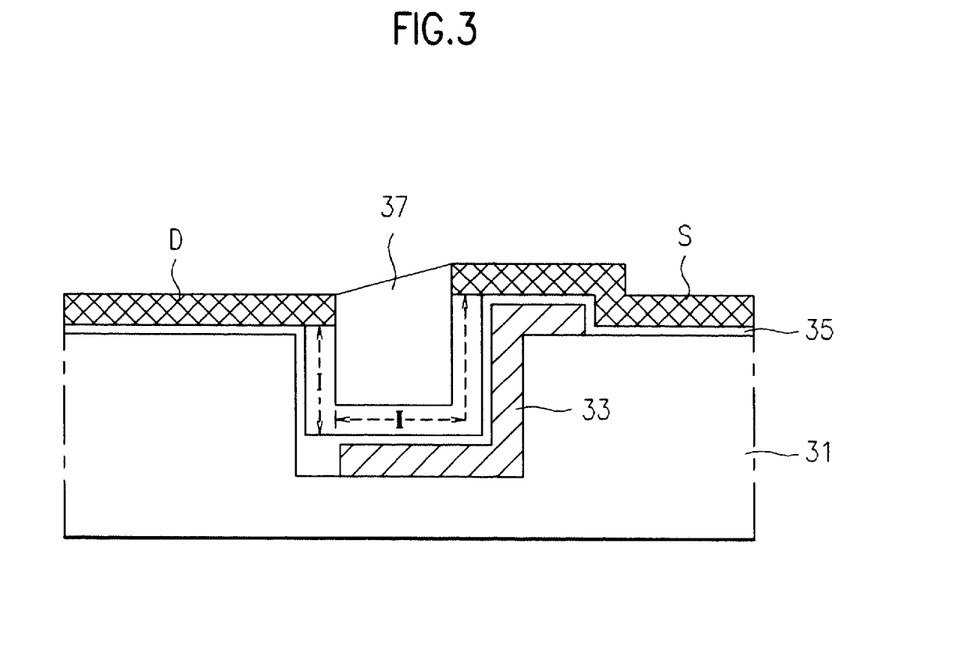
FIG. 3 is a cross-sectional view showing a structure of a TFT according to a preferred embodiment of the present invention.

FIG. 3 is a cross-sectional view showing a structure of a TFT according to a preferred embodiment of the present invention. The TFT includes a substrate 31 in which a trench having first and second sides and bottom is formed. A gate electrode 33 is formed on a predetermined area of the trench, and a gate insulating layer 35 is formed on the entire surface of the substrate 31 including the gate electrode 33. An active layer 36 is formed on the gate insulating layer 35. Source and drain regions are formed on the substrate 31 and are connected with the active layer 36 in the trench.

The substrate 31 is made of an insulating material, for example. An offset region I is formed on the second (left) side of the trench, and a channel region II is formed in the trench along the gate electrode 33. The gate electrode 33 overlaps the source region S. The offset region I extends perpendicularly up to the drain regions D.

A method for fabricating a TFT having the aforementioned structure will be described with reference to FIGS. 4A to 4E.

Figure 4A:
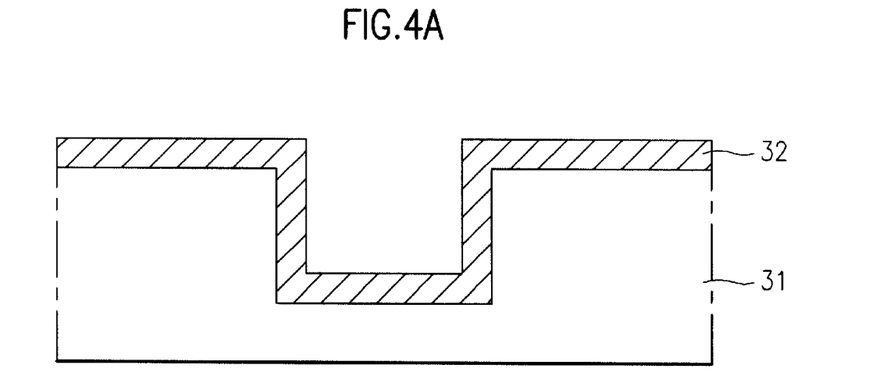
FIGS. 4A to 4E are cross-sectional views showing process steps of a method for fabricating a TFT according to a preferred embodiment of the present invention.

Referring to FIG. 4A, a predetermined area of a substrate 31 is etched to form a trench. The substrate 31 is made of an insulating material, for example. Alternatively, the substrate 31 may include an insulating layer formed on a semiconductor substrate. A polysilicon layer 32 is deposited on the entire surface of the substrate 31 including the trench. The polysilicon layer 32 is made of polysilicon doped with impurity ions, for example. Subsequently, a photoresist film (not shown) is coated on the polysilicon layer 32 and then patterned by an exposure and development process to form a photoresist pattern.

Figure 4B:
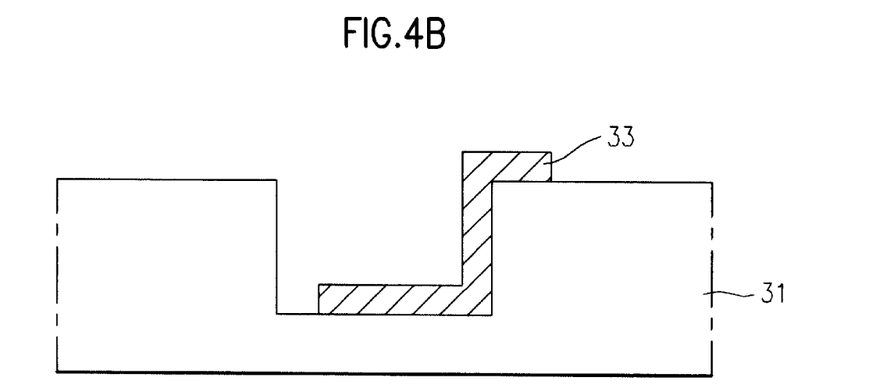

Referring to FIG. 4B, using the photoresist pattern as a mask, the polysilicon layer 32 is selectively etched for form a gate electrode 33 on a predetermined area of the trench and on a portion of the substrate 31 adjacent to the predetermined area of the trench. The resultant gate electrode 33 has a step-like shape.

Figure 4C:
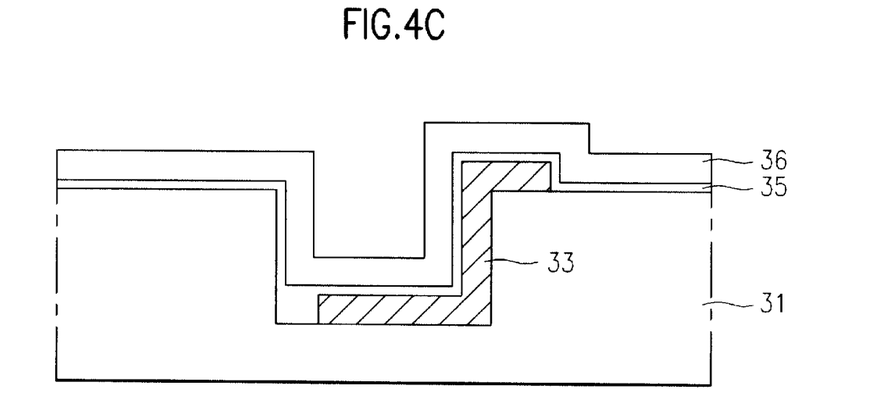

Referring to FIG. 4C, a gate insulating layer 35 is deposited over the substrate 31 including the gate electrode 33. An active layer 36 is formed over the gate insulating layer 35. The active layer 36 is an semiconductor layer and includes polysilicon not doped with impurities, for example.

Figure 4D:
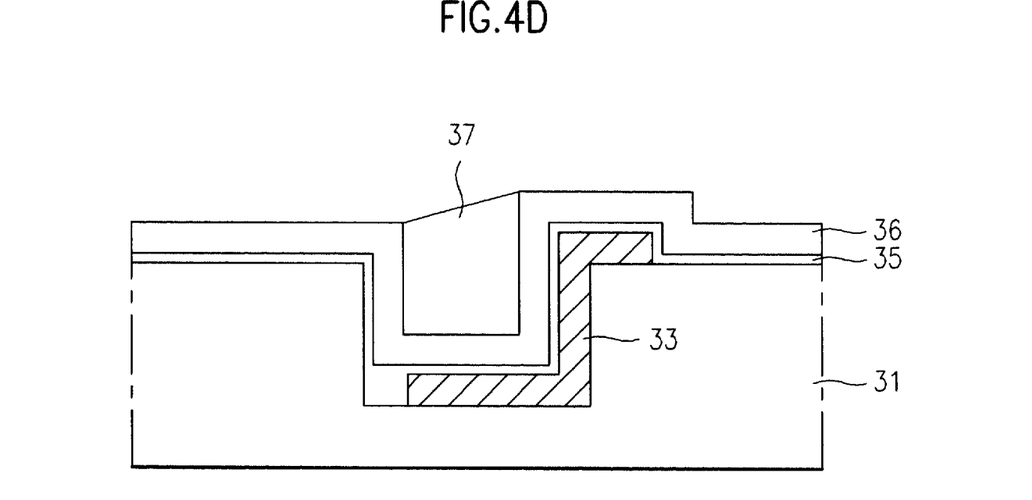

Referring to FIG. 4D, a thick insulating layer 37 is deposited on the active layer 36 and then is subject to an etch-back process. As a result, the insulating layer 37 is left to bury the trench.

Figure 4E:
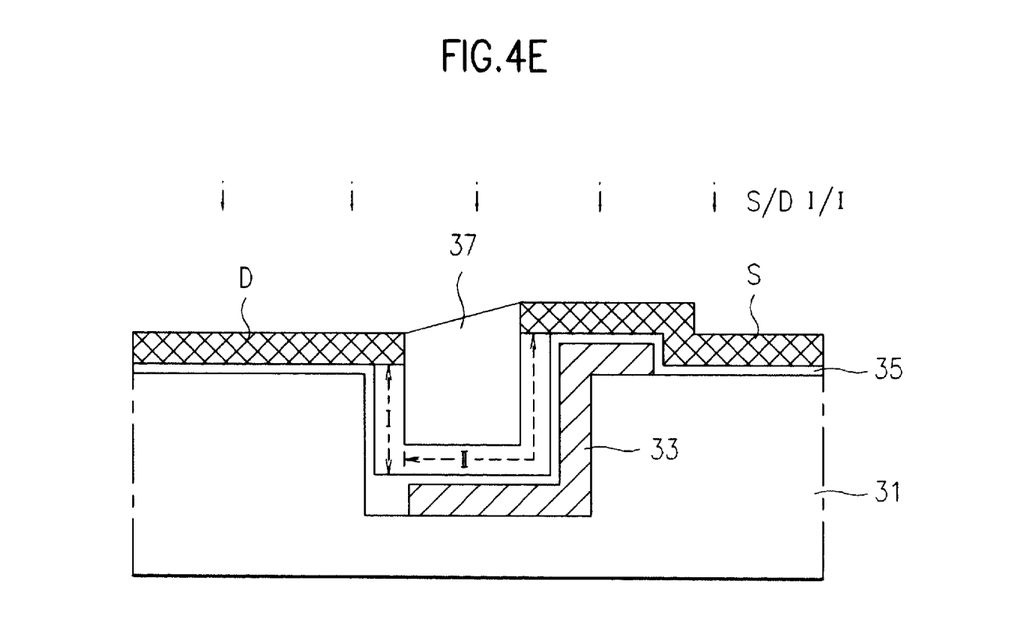

Referring to FIG. 4E, impurity ions are implanted into the entire surface to form source and drain regions. The energy of the impurity ions is adjusted such that the impurity ions are not implanted to the active layer 36 in the trench.

In this method, the ion-implanting process for forming source and drain regions is performed without using any masks, such that source and drain regions S and D are formed at the active layer 36 at both sides of the buried insulating layer 37. Here, impurity ions are not implanted into the active layer 36 in the trench.

A channel region II is a region of the active layer 36 in the trench corresponding to the gate electrode 33, and an offset region I is a region of the active layer 36 located on one (left) side of the trench. As described above, masks are not used to form the offset region I and the channel region II.

The TFT and the method for fabricating the same according to the preferred embodiment of the present invention above have the following advantages. A self-alignment process is performed to form a channel region and an offset region, thereby simplifying the overall process and producing consistent offset regions.

It will be apparent to those skilled in the art that various modification and variations can be made in the TFT and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a thin film transistor, the method comprising the steps of:

providing a substrate;

forming a trench having first and second sides and a bottom in the substrate;

forming a gate electrode on the bottom and the first side of the trench;

the gate electrode being absent on the second side of the trench forming a gate insulating layer on the substrate including the gate electrode;

forming an active layer on the gate insulating layer adjacent the trench; and forming source and drain regions in portions of the active layer that are located over an upper surface of the substrate, the source and drain regions being in contact with the rest of the active layer in the trench.

2. The method according to claim 1, wherein the step of forming the active layer includes forming a polysilicon layer.

3. The method according to claim 1, further comprising the step of forming an insulating layer on the active layer in the trench.

4. The method according to claim 3, wherein the step of forming the insulting layer includes the steps of:

forming the insulating layer over the overall surface of the substrate including the active layer; and removing portions of the insulating layer located over the upper surface of the substrate to leave the insulating layer only at the trench.

5. The method according to claim 1, wherein the step of forming the source and drain regions includes the steps of:

forming an insulating layer on a portion of the active layer that is located inside the trench; and implanting impurity ions into the active layer using the insulating layer as a mask to form the source and drain regions.

6. The method according to claim 5, wherein the step of forming the insulating layer includes the steps of:

forming the insulating layer over the overall surface of the substrate including the active layer; and removing portions of the insulating layer over the upper surface of the substrate to leave the insulating layer only in the trench.

7. The method according to claim 1, wherein the step of providing the substrate includes the step of forming an insulating layer on a semiconductor substrate.

8. A method for fabricating a thin film transistor on a substrate, the method comprising the steps of:

removing a portion of the substrate to form a trench in an upper surface of the substrate, the trench having inner walls including first and second side walls and a bottom wall;

forming a gate electrode on the second side wall and the bottom wall of the trench, the gate electrode extending from the upper edge of the second side wall along the upper surface of the substrate and being absent on the first side wall of the trench;

forming a gate insulating layer with a substantially consistent thickness over the entire surface of the substrate including the gate electrode and the trench;

forming a patterned semiconductor layer with a substantially consistent thickness over a portion of the gate insulating layer that is located over the first and second side walls and the bottom wall of the trench, the semiconductor layer having a first portion extending from the upper edge of the first side wall along the upper surface of the substrate, the semiconductor layer further having a second portion extending form the upper edge of the second side wall along the upper surface of the substrate;

forming an insulating filling on a portion of the semiconductor layer located in the trench between the first portion and the second portion of the semiconductor layer, the insulating filling being absent over each of the first and second portions of the semiconductor layer; and implanting impurity ions into the semiconductor layer using the insulating filling as a mask to form drain and source regions at the first and second portions of the semiconductor layer, respectively.

* * * * *

UNITED STATES PATENT AND TRADEMARK OFFICE
CERTIFICATE OF CORRECTION

PATENT NO. : 5,869,361
DATED : February 9, 1999
INVENTOR(S) : Seok-Won CHO

It is certified that error appears in the above-indentified patent and that said Letters Patent is hereby corrected as shown below:

Column 5, line 37, change "trench forming" to --trench; forming--.

Signed and Sealed this

Twenty-eighth Day of March, 2000

Attest:

Q. TODD DICKINSON

*Attesting Officer*  *Commissioner of Patents and Trademarks*